(12) United States Patent
Jeske et al.

(10) Patent No.: US 12,341,127 B2
(45) Date of Patent: Jun. 24, 2025

(54) SEMIFINISHED PRODUCT FOR POPULATING WITH COMPONENTS AND, METHOD FOR POPULATING SAME WITH COMPONENTS

(71) Applicant: Siemens Aktiengesellschaft, Munich (DE)

(72) Inventors: Nora Jeske, Berlin (DE); Bernd Müller, Falkenberg (DE); Christian Nachtigall-Schellenberg, Potsdam (DE); Jörg Strogies, Berlin (DE); Klaus Wilke, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 560 days.

(21) Appl. No.: 17/640,937

(22) PCT Filed: Sep. 3, 2020

(86) PCT No.: PCT/EP2020/074517
§ 371 (c)(1),
(2) Date: Mar. 7, 2022

(87) PCT Pub. No.: WO2021/043855
PCT Pub. Date: Mar. 11, 2021

(65) Prior Publication Data
US 2022/0336408 A1    Oct. 20, 2022

(30) Foreign Application Priority Data

Sep. 6, 2019 (DE) .................. 10 2019 213 609.5
Sep. 30, 2019 (DE) .................. 10 2019 214 996.0

(51) Int. Cl.
*H01L 23/00*  (2006.01)
*H01L 21/56*  (2006.01)
(Continued)

(52) U.S. Cl.
CPC .............. *H01L 24/83* (2013.01); *H01L 21/56* (2013.01); *H01L 24/29* (2013.01); *H01L 24/32* (2013.01);
(Continued)

(58) Field of Classification Search
CPC ......... H01L 24/73; H01L 21/56; H01L 24/81; H01L 21/563; H01L 24/30; H01L 24/83;
(Continued)

(56) References Cited

U.S. PATENT DOCUMENTS

| 2009/0315162 A1 | 12/2009 | Liu | 257/676 |
| 2012/0292778 A1 | 11/2012 | Liu et al. | 257/774 |

(Continued)

FOREIGN PATENT DOCUMENTS

| DE | 102013219303 A1 | 3/2015 | ............ H01L 21/56 |
| DE | 102014206608 A1 | 10/2015 | ............ H01L 21/48 |

(Continued)

OTHER PUBLICATIONS

German Office Action, Application No. 102019214996.0, 7 pages, May 8, 2020.
(Continued)

Primary Examiner — Mouloucoulaye Inoussa
(74) Attorney, Agent, or Firm — Slayden Grubert Beard PLLC

(57) ABSTRACT

Various embodiments of the teachings herein include a semifinished product for use in the populating of a power electronics component by a connecting method. The product includes an electrically insulating prepreg frame electrically insulated. The prepreg frame is configured for surrounding an applied connecting material at a metallized installation site during the population. A material of the prepreg frame enables simultaneous processability of electrical connection and electrical insulation by compression of the insulation
(Continued)

material in the form of the semifinished product since the processing parameters of the electrical connecting material and the semifinished product are compatible.

11 Claims, 2 Drawing Sheets

(51) Int. Cl.
*H01L 25/07* (2006.01)
*H01L 25/18* (2023.01)

(52) U.S. Cl.
CPC ............ *H01L 24/95* (2013.01); *H01L 25/072* (2013.01); *H01L 25/18* (2013.01); *H01L 2224/29111* (2013.01); *H01L 2224/29113* (2013.01); *H01L 2224/29139* (2013.01); *H01L 2224/29147* (2013.01); *H01L 2224/2929* (2013.01); *H01L 2224/29339* (2013.01); *H01L 2224/32225* (2013.01); *H01L 2224/83192* (2013.01); *H01L 2224/83201* (2013.01); *H01L 2224/83801* (2013.01); *H01L 2224/8384* (2013.01); *H01L 2224/83851* (2013.01); *H01L 2224/83948* (2013.01); *H01L 2224/95* (2013.01); *H01L 2924/014* (2013.01); *H01L 2924/0635* (2013.01); *H01L 2924/0665* (2013.01)

(58) Field of Classification Search
CPC ......... H01L 24/92; H01L 24/29; H01L 24/32; H01L 24/16; H01L 25/072; H01L 23/3735; H01L 21/6835; H01L 23/295; H01L 23/2128; H01L 21/565; H01L 23/147; H01L 25/18; H01L 24/08; H01L 25/50; H01L 23/5384; H01L 23/49827; H01L 23/562; H01L 23/3135; H01L 21/486; H01L 23/49816; H01L 25/0655; H01L 24/80; H01L 25/0652; H01L 23/31; H01L 23/49811; H01L 23/5385; H01L 23/5383; H01L 24/19; H01L 23/13; H01L 25/0657; H01L 29/0657; H01L 21/76802; H01L 25/05; H01L 23/5386; H01L 23/5389; H01L 2224/81203; H01L 2224/13339; H01L 2224/29139; H01L 2224/83201; H01L 2224/83948; H01L 2924/014; H01L 2224/2911; H01L 2224/06051; H01L 2224/83693; H01L 2224/291; H01L 2224/3003; H01L 2924/0635; H01L 2924/00014; H01L 2224/13347; H01L 2224/80097; H01L 2224/80447; H01L 2224/8083; H01L 2224/808; H01L 2224/80895; H01L 2224/8034; H01L 2224/80906; H01L 2221/68327; H01L 2224/05647; H01L 2224/08225; H01L 2224/80099; H01L 2224/0391; H01L 2224/80201; H01L 2224/80357; H01L 2224/08145; H01L 2224/80948; H01L 2224/80896; H01L 2224/8003

See application file for complete search history.

(56) References Cited

U.S. PATENT DOCUMENTS

| | | | |
|---|---|---|---|
| 2015/0228616 A1 | 8/2015 | Palm | H01L 23/00 |
| 2017/0117162 A1 | 4/2017 | Busche et al. | 438/121 |
| 2018/0182651 A1 | 6/2018 | Cardwell | |
| 2018/0213647 A1 | 7/2018 | Gavagnin et al. | |
| 2019/0157242 A1 | 5/2019 | Moitzi et al. | |
| 2019/0181310 A1 | 6/2019 | Boss et al. | |
| 2021/0398950 A1* | 12/2021 | Nakata | H01L 24/33 |
| 2022/0262713 A1* | 8/2022 | Na | H01L 21/4857 |

FOREIGN PATENT DOCUMENTS

| | | | | |
|---|---|---|---|---|
| DE | 10 2014 211 467 | | 12/2015 | ........... H01L 23/492 |
| DE | 102016115629 A1 | | 3/2018 | ............ H01L 21/56 |
| DE | 102016125521 A1 | | 6/2018 | ............ H01L 21/58 |
| JP | 11220066 A | | 8/1999 | ............ H01L 21/56 |
| JP | 2003188314 A | | 7/2003 | ............ H01L 23/12 |
| JP | 2007115952 A | | 5/2007 | ............ H01L 23/12 |

OTHER PUBLICATIONS

Search Report for International Application No. PCT/EP2020/074517, 16 pages, Nov. 16, 2020.

Chinese Office Action, Application No. 202080073829.8, 8 pages, Nov. 6, 2024.

* cited by examiner

SEMIFINISHED PRODUCT FOR POPULATING WITH COMPONENTS AND, METHOD FOR POPULATING SAME WITH COMPONENTS

CROSS-REFERENCE TO RELATED APPLICATIONS

This application is a U.S. National Stage Application of International Application No. PCT/EP2020/074517 filed Sep. 30, 2020, which designates the United States of America, and claims priority to DE Application No. 10 2019 214 996.0 filed Sep. 30, 2019 and DE Application No. 10 2019 213 609.5 filed Sep. 6, 2019, the contents of which are hereby incorporated by reference in their entirety.

TECHNICAL FIELD

The present disclosure relates to power electronics. Various embodiments of the teachings herein include semifinished products in component population or a component encapsulation, and/or methods using a semifinished product in a connecting method in the population of semiconductor components.

BACKGROUND

For use in the assembly of power electronics components, especially direct chip assembly of semiconductors, a highly effective electrically insulating encapsulation of the interstices between substrate surfaces and exposed semiconductor components such as chip surfaces is important in order that the required insulation, by virtue of the encapsulation, is stable and sufficiently insulating even under unfavorable conditions—especially ambient conditions. Electronic assemblies in power electronics comprising one or more power semiconductors are typically produced with the aid of connecting methods in the population of semiconductor components such as adhesive bonds, solder bonds and/or by pressure sintering technology on a substrate, for example a ceramic substrate, such as an interconnect device. More particularly, ceramic interconnect devices are used as substrate, called DCB substrates or direct copper-bonded substrates.

For this purpose, for example, a substrate to be populated with components is mounted by pressure sintering with a connecting layer. In the case of pressure sintering, in general, first the substrate board and the components are bonded, followed by the electrical contacting of the module, but the production process can also run in the reverse sequence. For production of an insulating encapsulation of a power electronics component—for example in the case of pressure sintering technology and/or soldering technology, multistage methods are employed, in which, in a technologically complex sequential process, a bond is first established by pressure sintering. In the next working step, the interstices and gaps are then sealed by an underfill process. As stated, the underfill process is an extra working step that incurs costs and takes time.

In spite of this complex method, there are still problems in the insulating encapsulation of the gaps and/or interstices if the underfill process does not completely seal and/or complement the encapsulation produced by pressure sintering.

SUMMARY

The teachings of the present disclosure include techniques for production of an effectively insulating encapsulation that overcomes the disadvantages of the prior art and especially solves the problem of sealing of the interstices and/or gaps in the population in a simple and inexpensive manner which is suitable for mass production. For example, some embodiments of the teachings herein include a semifinished product (6) for use in the populating of a power electronics component (7) by a connecting method, wherein the semifinished product (6) forms a frame which is a prepreg and is electrically insulated, which is suitable for surrounding the applied connecting material (3) at a metallized installation site (1, 2) during the populating because the material of the semifinished product enables simultaneous processability of electrical connection and electrical insulation by compression of the insulation material in the form of the semifinished product, since the processing parameters of the electrical connecting material and the semifinished product are largely compatible.

Some embodiments are essentially a dielectric resin.

Some embodiments comprise a synthetic resin reinforced by reinforcing fibers.

Some embodiment comprise a resin or a resin mixture at the B stage.

Some embodiments comprise a filler-filled resin or a filler-filled resin mixture.

In some embodiments, the material of the semifinished product is selected from the group of the following compounds: epoxy resin, polyurethane resin, rubber, novolak and/or unsaturated polyester resin.

Some embodiments have been prefabricated for a power electronics component (7) to be populated.

Some embodiments have been cut to the size of at least one connection pad (5) of the power electronics component (1) to be encapsulated.

Some embodiments have been cut to the size of standardized components (7) so as to be suitable for mass production.

As another example, some embodiments include a method of encapsulating a power electronics component, comprising: providing at least one installation site (1, 2) by means of metallization on a substrate applying an electrically conductive connecting material (3); prefabricating at least one semifinished product (6) in the form of a frame for framing the applied connecting material (3) at an installation site (1, 2); positioning the prefabricated semifinished product (6) at an installation site (1, 2) around the electrically conductive connecting material (3); populating the installation site (1, 2) and the connecting material (3) with a semiconductor component (7); introducing the substrate thus prepared into an apparatus for performance of the connecting method, especially into a pressure sinter press; and simultaneously connecting the semiconductor component (7) in an electrically conductive manner and insulating from the semifinished product (6) at the metallized installation site (1, 2) of the substrate.

Some embodiments further heat treatment of the component that has been electrically connected by pressure sintering, soldering and/or adhesive bonding and encapsulated by melting of the semifinished product for complete curing of the resin.

As another example, some embodiments include the use of one or more semifinished product(s) in the processing of power electronics components.

Some embodiments include the use of the products in the simultaneous production of an electrical connection and an insulation by pressure sintering.

In some embodiments, the semifinished product(s) take(s) the form of prefabricated, partly crosslinked materials at the B stage.

In some embodiments, the products are used in the production of encapsulations in the population of power electronics components.

BRIEF DESCRIPTION OF THE DRAWINGS

The teachings are further elucidated in more detail hereinafter with reference to a schematic sequence of the method in FIGS. 1 to 4.

DETAILED DESCRIPTION

Figure 1:
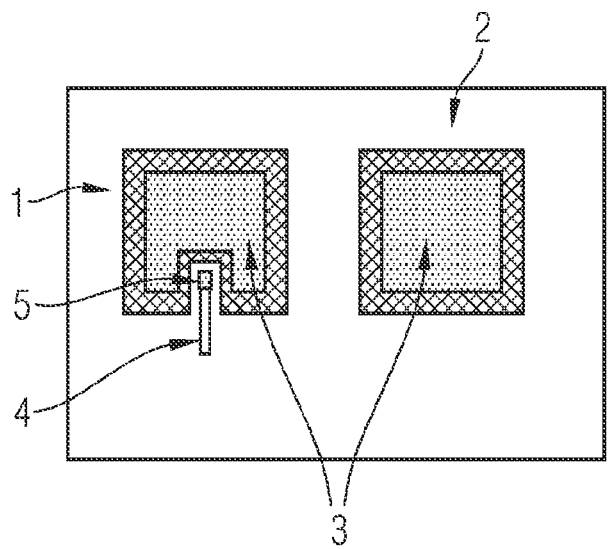
FIG. 1 shows, in top view, two predefined installation sites with applied connecting material, i.e., for example, applied sinter material.

Some embodiments of the teachings herein include a semifinished product for use in the populating of a power electronics component by a connecting method, wherein the semifinished product forms a frame which is suitable for surrounding the applied connecting material at a metallized installation site during the populating. Some embodiments include the use of a semifinished product in the building of a power electronics component by means of connection technology.

In some embodiments, a method of populating a substrate with a power electronics component comprises:
  providing at least one installation site (1, 2) by means of metallization on a substrate
  applying an electrically conductive connecting material (3)
  prefabricating a semifinished product (6) in the form of a frame for framing the applied connecting material (3) on the substrate
  positioning the prefabricated semifinished product (6) on the substrate around the electrically conductive connecting material (3)
  populating the installation site and the connecting material with a semiconductor component (7)
  introducing the workpiece thus prepared into an apparatus for performance of the connecting method, especially into a pressure sinter press,
  simultaneously connecting the semiconductor component (7) in an electrically conductive manner and insulating with the semifinished product (6) at the metallized installation site (1, 2) of the substrate.

In some embodiments, the use of a semifinished product—especially one that has been prefabricated—enables simultaneous processability of electrical connection by, for example, pressure sintering of correspondingly usable connecting material and establishment of an insulating encapsulation by compression of the insulation material in the form of the semifinished product when the processing parameters, for example pressure, temperature, the connecting material and the semifinished product, are largely compatible.

In some embodiments, the synthetic resins from which the semifinished products are made by way of example show superior material properties to the underfill materials, such as, in particular, glass transition temperature, sustained use temperature stability and the like.

The semifinished product especially comprises a dielectric and thermoset resin in a B state. In the B state, the shape of the semifinished product is fixed, but it turns liquid when the pressure and/or temperature is increased because the B state is a partly crosslinked state of a polymer in which the thermoset properties, i.e. those that are no longer alterable by increasing temperature, of the polymeric resin are not yet dominant. The resin in the B state that has been liquefied by increasing temperature flows into interstices and/or gaps between the encapsulation produced by soldering and/or pressure sintering or the like and the substrate and/or the surfaces of the components. The resin of the semifinished product solidifies therein as an irreversible thermoset when the temperature is increased. The rest of the semifinished product—if it is troublesome in any way—is easily removable and is removed by wiping it off, pulling it off and/or cutting it off, for example after the pressure sintering and optionally the prepreg press.

Semifinished products in the context of the present disclosure are resin elements in the B state that are liquefied by increasing the pressure/heating, but have thermoset properties on completion of through-curing and crosslinking of the resin, i.e. cannot change shape without decomposition through heating. Suitable resins in the context of the present invention for production of the semifinished product are especially thermosets. Thermosets refer to polymers that are no longer deformed and/or meltable without decomposition after the curing. They comprise hard amorphous insoluble polymers. The precursors thereof, called prepolymers, are synthetic resins that are still meltable and therefore liquefiable. The semifinished product according to the present invention is such a synthetic resin.

In some embodiments, there is a carrier in the form of reinforcing fibers in the semifinished product. These may take the form of a laid scrim, of a weave and/or else of a fiber bundle. Reinforcing fibers used may be glass fibers, carbon fibers, aramid fibers, ceramic fibers etc. These may then be embedded in the synthetic resin that forms the matrix.

Examples of compounds that form such synthetic resins are epoxy resins, polyurethanes, rubbers—natural, nature-identical and/or vulcanized rubbers, novolaks, unsaturated polyester resins, and any mixtures, copolymers and/or blends of the aforementioned compounds, and further compounds known to the person skilled in the art—especially those usable as thermosets in the form of corresponding prepolymers. In the semifinished product, there may be a resin composed solely of one compound or a resin composed of a blend and/or copolymer of different compounds.

In order to obtain specific properties of the semifinished product and/or the cured thermosets thereof, it is possible to mix one or more filler(s) and/or one or more additive(s) into the resin or resin mixture.

In some embodiments, the semifinished product is prefabricated and matched to the power electronics component to be populated and/or encapsulated. There are different levels of accuracy in this regard, which are used according to the application. More particularly, it is possible here, in a manner suitable for mass production, to prefabricate a semifinished product which is usable universally within certain limits, but it is also possible—for any component according to the application—to specially create an exactly fitting semifinished product with the correct dimensions. There are no restrictions in this regard within the scope of the present disclosure.

For example, the semifinished product, in the course of prefabrication, is matched in terms of its size and/or shape, its circumference, its (layer) thickness, its surface characteristics and/or its processability—in each case with implementation of the criteria mentioned individually or collectively or in any combination—to the connecting material applied, to the substrate and/or to the component to be encapsulated. Particularly the adjustments in form, shape, angle measurement, thickness, height, width, length and/or generally size are referred to as "prefabrication".

A suitable example of a connecting material is a sinter material and/or a solder material and/or an electrically conductive polymer material and/or a conductive adhesive. Examples of sinter pastes are silver- and/or copper-based sinter pastes, for example from the manufacturers Alpha or Heraeus, which are usable in the form of pastes and/or else in the form of moldings.

Suitable solder materials are typically the solder compounds, especially in the form of alloys, e.g. SnAg3Cu0.5, SnAg3Cu0.7, SnCu0.7, SnAg3.5, Sn-58Bi, which are again usable in the form of pastes and/or else in the form of moldings.

Conductive adhesives used may, for example, be epoxy resin-based, or acrylate resin-based—again by way of example—with metallic fillers usable as conductive medium, for example silver particles.

In some embodiments, the unliquefied resin of the semifinished product remains as insulation on the substrate after the pressure sintering. In some embodiments, excess resin of the semifinished product is structured and/or removed after the populating. For this purpose, for example, the excess semifinished product is pulled off, cut off and/or lasered off on completion of encapsulation.

In some embodiments, apart from the application of connecting material, the populating with semiconductor components and connection by pressure sintering and/or soldering are preceded by placing of prefabricated semifinished product frames around the application of connecting material on the power electronics component, such that some of the one or more semifinished product frames become liquid during the pressure sintering and penetrate into the gaps and interstices. The still-liquid resin is held therein by capillary forces, for example.

For the bonding, for example, a pressure sinter press, an apparatus for soldering and/or some other treatment by pressure and/or temperature is used to give the electrically conductive connection of the metallized substrate to the electronic semiconductor component, especially for power electronics. An example of a pressure sinter press used may be a mechanical servo press for generation of mechanical pressure on components to be joined.

For example, the pressure sintering is conducted with the following parameters: sinter pressures in the pressure sintering, for example in the range from 10 to 20 MPa, temperatures, for example, in the range from 230° C. to 260° C. with sintering times, for example, in the range from 120 to 240 seconds. These figures are merely examples and may each exist in any combination and entirely independently of one another.

For example, the soldering here, depending of course on the melting point and/or melting range of the alloy(s) used, is conducted at process temperatures of 150° C. to 250° C. For example, the solder material "SAC305®" with 96.5% by weight of Sn, 3.0% by weight of Ag and 0.5% by weight of Cu has a melting point of about 217° C.

On completion of connection by, for example, pressure sintering or soldering and cooling of the power electronics components, the resin in thermoset form fills the interstices and gaps irreversibly and in a fixed shape.

In some embodiments, the power electronics component encapsulated by a connecting technique such as pressure sintering and/or soldering of a component together with the semifinished product is subjected to heat treatment, i.e. further curing.

FIG. 1 shows two installation sites 1 and 2 that are to be populated with semiconductor components such as chip, diode, FET field-effect transistor, IGBT/power FET-FC pad configuration, FFC and/or diode pad configuration 1 and 2. On the left is an installation site for a multipotentially connectable semiconductor component 1, and on the right an installation site for a unipotentially connectable semiconductor component 2. In the embodiment shown here, both are present on a substrate, for example a ceramic substrate, which in each case has the metallization typical of the installation site. The installation site 1—in the form, for example, of an IGBT-FC pad configuration, shows an electrical pad connection 4 and is therefore electrically connected in a multipotential manner in the assembly. To the right of that lies an installation site 2 for a semiconductor component such as an FFC or diode pad configuration, which is unipotentially connected, i.e. electrically contacted, in the assembly.

Both installation sites 1 and 2, according to FIG. 1, already have an application of electrically conductive connecting material 3 in the middle, with the installation site 1 to be connected in a multipotential manner also having an application of electrically conductive connecting material 3 at the connection pad 5. A suitable electrically conductive connecting material 3 is, for example, sinter material and/or solder material and/or other electrically conductive plastic material and/or conductive adhesive.

Figure 2:
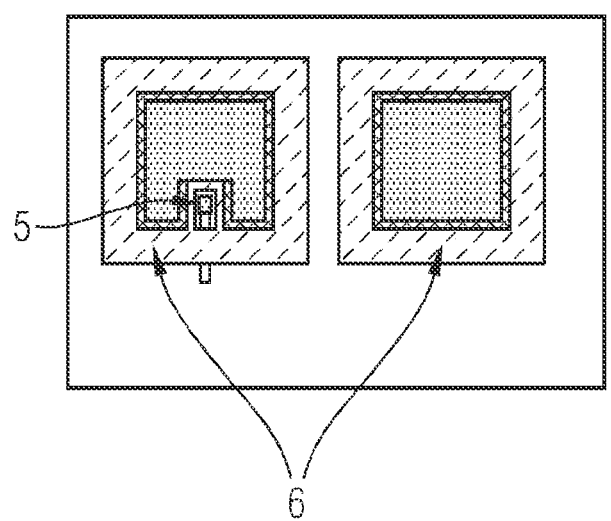
FIG. 2 shows the same top view, with a semifinished product frame around the two installation sites.

FIG. 2 shows the same view of the substrate from the top with the installation sites 1 and 2, except that a semifinished product 6 here is already placed as frame around the electrically conductive connecting material 3, for example the sinter material 3. It is particularly readily apparent here how the prefabricated frame 6—possibly even individually prefabricated—surrounds the sinter material on the connection pad 5 of the installation site 1. This is an example of a semifinished product 6 prefabricated for a semiconductor component 1. The semifinished product 6 that serves as insulation frame is a prepreg, i.e. a synthetic resin in the form of a B-stage polymer, in some cases with a fiber reinforcement, for example a glass fiber reinforcement.

In some embodiments, the semifinished products 6 are used in mass production, including the use of standardized semifinished products 6 for standardized power electronics semiconductor components without individually adjusted prefabrication. The semifinished product 6 may, for example, be positioned in an automated manner and/or with standard population devices.

"Standardized" refers not only to semiconductor components stipulated as international standards, but generally to semiconductor components produced as mass products and corresponding semifinished products and population devices.

Figure 3:
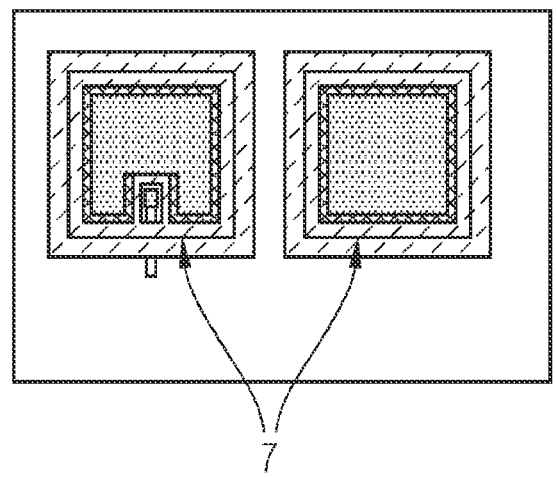
FIG. 3 again shows the same top view, one processing step further with each of the power electronics components applied atop the connecting material.

FIG. 3 shows, in a top view, the two semiconductor components in the two installation sites 1 and 2, for example dies 7 applied by high-temperature population. After the population and connection with simultaneous insulation of the semiconductor component (7) in an installation site (1, 2), the populated substrate may be subjected to another thermal treatment in order that the electrically conductive connection and the insulating encapsulation are respectively consolidated and fully through-cured.

In some embodiments, the component bonded by pressure sintering, soldering and/or adhesive bonding and encapsulated by melting the semifinished product is subjected to further heat treatment for complete curing of the resin or of the electrically conductive sinter bond, solder bond and/or adhesive bond.

Figure 4:
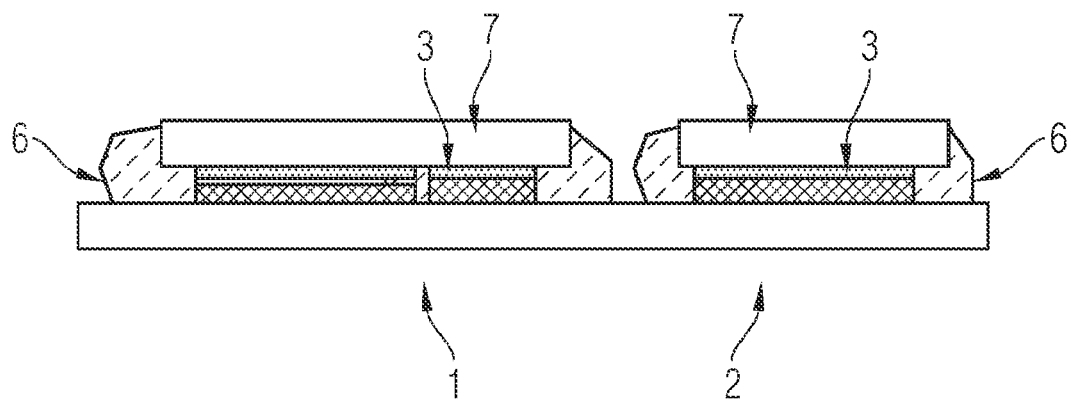
FIG. 4 again shows one process step further after the pressure sintering, the mounted power electronics components on a substrate.

Finally, FIG. 4 shows the layer construction of the populated substrate shown in bird's-eye view in FIGS. 1 to 3 at the location of installation sites 1 and 2 as a cross-sectional view. The following layers can be seen in the two components 1 and 2: semifinished product layer 6 that laterally frames the construction is the resin from the semifinished product 6 distributed in the interstices and/or gaps by pressure sintering. Layer 3 shows the sinter material 3 solidified by pressure sintering. The components 7 sit on top of the installation sites 1 and 2 galvanically connected by sinter material 3 and electrically insulated by resin 6.

The teachings herein may provide process simplification by simultaneous processing, absence of a dispensing application method, such as the underfill method with the corresponding complexity and sources of error, significant shortening of the production times by avoidance of long curing steps, and further utilization and transfer of experience gained from printed circuit board manufacturer with regard to material and processing.

The methods and systems described herein may make it possible for the first time to produce, in one process step, a sealed insulating encapsulation by a connecting method, for example pressure sintering. For this purpose, an electrically insulating semifinished product in the B state is applied around the electrically conductive connecting material, for example the sinter material, prior to the pressure sintering. It is a particular feature of the invention that, in the population of semiconductor components in one operation, preferably by pressure sintering, there is simultaneous electrical connection and electrical insulation.

What is claimed is:

1. A semifinished product for use in populating of a power electronics component by a connecting method, the semifinished product comprising:
    an electrically insulating prepreg frame configured to surround an applied connecting material at a metallized installation site to be subsequently populated with the power electronics component and connected by pressure sintering and/or soldering;
    wherein a material of the prepreg frame enables simultaneous processability of electrical connection and electrical insulation by compression of the prepreg frame since the processing parameters of the electrical connecting material and the semifinished product are compatible.

2. The semifinished product as claimed in claim 1, wherein the prepreg frame consists of essentially a dielectric resin.

3. The semifinished product as claimed in claim 1, wherein the prepreg frame comprises a synthetic resin reinforced by fibers.

4. The semifinished product as claimed in claim 1, wherein the prepreg frame comprises a resin or a resin mixture at the B stage.

5. The semifinished product as claimed in claim 1, wherein the prepreg frame comprises a filler-filled resin or a filler-filled resin mixture.

6. The semifinished product as claimed in claim 1, wherein the prepreg frame comprises at least one material selected from the group consisting of: epoxy resin, polyurethane resin, rubber, novolak, and unsaturated polyester resin.

7. The semifinished product as claimed in claim 1, wherein the prepreg frame has been prefabricated for a power electronics component to be populated.

8. The semifinished product as claimed in claim 1, wherein the prepreg frame has been cut to the size of a connection pad of the power electronics component to be encapsulated.

9. The semifinished product as claimed in claim 1, wherein the prepreg frame has been cut to the size of standardized components to be suitable for mass production.

10. A method of encapsulating a power electronics component, the method comprising:
    providing an installation site using metallization on a substrate;
    applying an electrically conductive connecting material to the installation site;
    fabricating a semifinished product comprising a frame for framing the connecting material at the installation site;
    positioning the semifinished product at the installation site around the electrically conductive connecting material;
    subsequently populating the substrate with a semiconductor component;
    introducing the populated substrate into an apparatus for connecting the semiconductor component; and
    simultaneously connecting the semiconductor component in an electrically conductive manner and insulating from the semifinished product at the metallized installation site.

11. The method as claimed in claim 10, further comprising applying additional heat treatment of the component using pressure sintering, soldering, and/or adhesive bonding by melting of the semifinished product for complete curing of a resin.

* * * * *